Nov. 14, 1961 J. KOSTELEC 3,009,006

PHOTOELECTRIC CELL

Filed March 12, 1959

INVENTOR.
JOŽE KOSTELEC

BY Henry W. Coughlin
Edward P. Gilkeany
ATTORNEYS

United States Patent Office 3,009,006
Patented Nov. 14, 1961

3,009,006
PHOTOELECTRIC CELL

Jozé Kostelec, Binghamton, N.Y., assignor to General Aniline & Film Corporation, New York, N.Y., a corporation of Delaware Filed Mar. 12, 1959, Ser. No. 798,989
3 Claims. (Cl. 136—89)

This invention relates to photoelectricity and to a device capable of transforming light energy into electrical energy.

It is well known that the electrical properties of certain materials are affected by the action of light. This phenomenon is commonly referred to as the photoelectric effect and, generally speaking, is manifested in two ways: (1) a change in the electrical resistance of certain substances when they are exposed to radiant energy such as light; (2) when certain substances are exposed to radiant energy such as light, a flow of electrons takes place in or from those substances.

A useful application of the photoelectric effect is exemplified by the photoelectric cell, a device which is capable of transforming radiant energy into electrical energy and thus falls under item (2) above.

Photoelectric cells may be classified as (1) the photovoltaic type wherein an electromotive force is formed within the cell on exposure to radiation; and (2) the photoemissive type wherein electrons are emitted on exposure of the cell to an external source of electrical energy for its operation. Photoelectric cells of the photovoltaic type (1) commonly embody a laminar type of construction comprising contiguous layers of certain light sensitive materials such as cuprous oxide or selenium with a suitable conducting surface or layer and the entire construction incorporated in an electric circuit. Upon exposure to light, an electromotive force is established across the light sensitive material and the conducting surface.

Ordinarily, the photoelectric cells of the prior art make use of an inorganic light sensitive material of which the preferred choice is cuprous oxide or an element of the sixth group of the periodic table of elements, particularly selenium. More recently, photoelectric cells have been produced wherein fused crystalline silicon of high purity is utilized as the light sensitive material.

Although the photoelectric effects have also been observed in other substances, they are, on the whole, unsuitable for the construction of a practical working photoelectric cell. Consequently, there are actually very few photoelectrically active substances which are available for use or incorporation in a photoelectric cell having practical application and utilization.

It is, therefore, an object of the invention to provide a photoelectric cell having a novel light sensitive material.

It is a further object of the invention to provide an improved photoelectric cell in which the light sensitive material is an organic dye.

It is a still further object of the invention to provide a method of making light sensitive electric devices utilizing an organic dye as the light sensitive material.

Other objects will become apparent as the description proceeds.

This invention is based upon the discovered that certain organic dyes, when properly incorporated as the light sensitive material in a photoelectric cell construction, are capable of converting electromagnetic radiant energy into electrical energy. In an example of practice illustrative of this invention, a relatively thin layer of the organic dye is placed between two conducting electrodes, at least one of which is transparent to the exciting radiation. A transparent electrode which I have found convenient for this purpose comprises a glass plate having on one side thereof a conducting film in which the said conducting film is placed next to the organic dye layer.

Reference is now made to the various drawings for a more detailed description of the invention.

Figure 1:
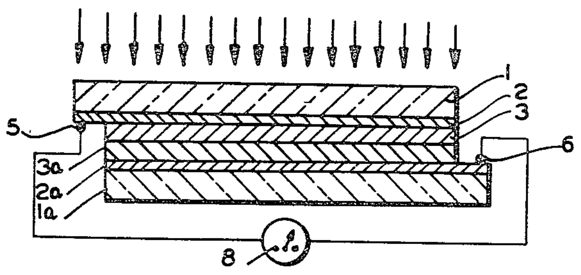
FIG. 1 shows in cross-section, a photoelectric cell embodying this invention and the arrangement of the light sensitive composition between transparent electrodes.

Referring more particularly to the drawings, FIG. 1 is a schematic diagram of a photoelectric cell containing an organic dye as the light sensitive element. In this particular embodiment, the cell comprises two glass plates 1 and 1*a* having on one side thereon, a conducting transparent coating or surface designated 2 and 2*a*. In between the two glass plates and in electrical contact with the transparent conducting surfaces 2 and 2*a* is the composite organic dye layers 3 and 3*a* which make up the light sensitive component of the cell. When the assembly is exposed to light, as indicated by the arrows in the drawing or other suitable radiation, a potential difference between electrodes 5 and 6 is indicated on the meter 8.

Figure 2:
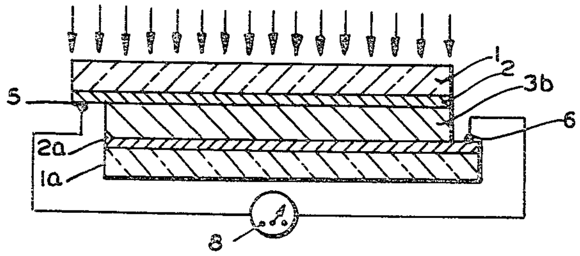
FIG. 2 shows in cross-section, a photoelectric cell embodying a different arrangement of the light sensitive composition between transparent electrodes.

FIG. 2 is essentially the same construction as that of FIG. 1 except for the manner in which the sensitizing or organic dye is placed between the conducting glass plates.

Figure 3:
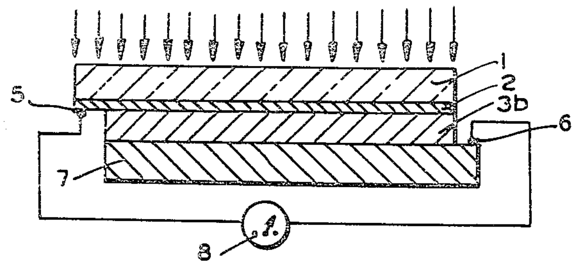
FIG. 3 shows in cross-section, a photoelectric cell of the type illustrated in FIGS. 1 and 2 except one of the transparent electrodes is replaced by an opaque conducting plate or base.

FIG. 3 shows another construction of my photoelectric cell wherein an opaque metal base 7 replaces one of the transparent conducting glass electrodes.

Figure 4:
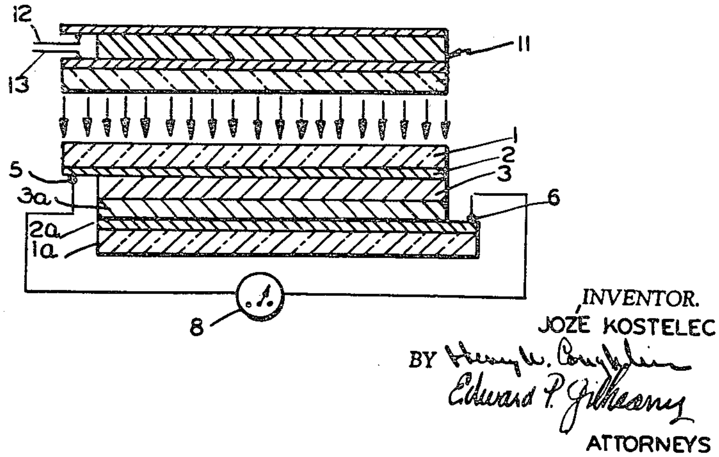
FIG. 4 shows the cell of FIG. 1 placed beneath an electroluminescent layer or panel having an A.C. input applied thereto.

FIG. 4 illustrates an arrangement whereby the photoelectric cell of the invention can be employed for the rectification of alternating current into direct current. When an A.C. field is applied across the terminals 12 and 13, the electroluminescent layer 11 radiates in the visible portion of the electromagnetic spectrum. Light from the excited electroluminescent layer or panel 11 then falls upon the upper surface of the photoelectric cell of the type shown in FIG. 1 whereby the incident light is converted into a D.C. output at the terminals 5 and 6 so that the overall reaction is alternating current into light into direct current.

The dyes of the type suitable for practicing the invention are, generally speaking, members of that class of dyes used as sensitizers in electrophotography. Examples of the various groups of dyes falling within this classification which I have found effective for my purpose include the phthalein dyes, i.e., eosin, rose bengal, fluoroescein, erythrosin and other fluorescein types, and triphenylmethane types such as crystal violet and malachite green.

Of the various dyes named above, I prefer to use rose bengal since it is easy to prepare photoelectric cells with this dye as the light sensitive substance and, furthermore, rose bengal produces a relatively high D.C. output for a given amount of illumination.

The electrically conducting electrodes, FIGS. 1 and 2 of the drawings, comprise transparent conducting surfaces 2 and 2*a* bonded to glass plates 1 and 1*a*, respectively.

A product particularly applicable in this connection is a type of glass obtainable on the market under the trade name "Nesa Glass" available in various thicknesses and sizes, comprises a glass plate having on one side thereof, a thin, transparent, electrically conductive surface.

The photoelectric cells of the type shown in FIG. 1 were made as follows: 0.05 gram of a sensitizing dye such as rose bengal was dissolved in 3 ml. of methanol and the resulting solution poured onto the conducting surface 2 or **2*a* of the "Nesa Glass" plate, the dimensions of which were about 2½ x 2½ inches. The dye solution was used in sufficient quantity to completely cover the surface with an even film of liquid after which the solvent was allowed to evaporate at room temperature. There was thus obtained a thin layer of solid crystalline dye, indicated as 3 or 3*a* in FIG. 1, firmly bonded to the conductive transparent coating 2 or 2*a*** of the glass plate. The two glass plates were then pressed firmly together with the dye surfaces in contact with each other. When the two layers are placed in contact, it is convenient to arrange the construction in such a manner that the two plates are not completely congruent. One edge of the upper plate advantageously projects over the corresponding edge of the lower plate in order to create an overhang or offset on diametrically opposite sides of the cell. In this manner, the take-off electrodes are readily attached to the conducting surfaces as shown in the drawing of FIG. 1.

The photoelectric cell shown in FIG. 2 is constructed quite similarly to the cell of FIG. 1. However, in preparing the cell of FIG. 2, the dye surfaces of the glass plates are placed in contact while still moist with solvent. Thus, the solvent evaporates out from the edges of the glass plates leaving a continuous matrix **3*b* of dye between the electrodes. The electrical properties of the cells so constructed were identical in all respects to the cells prepared with the separately deposited dye layers thus demonstrating that no barrier effect is produced at the junction of the separate dye layers 3 and 3*a*** shown by the construction of FIG. 1. With a completely continuous matrix of dye between the glass plates, the possibility exists that the glass conducting surfaces might come in contact while wet with solvent thus neutralizing the potential across the electrodes. Furthermore, it is difficult to remove the solvent once the plates have been placed in contact since evaporation out through the edges makes it difficult for the solvent molecules to escape. In this connection, it should be mentioned that it is imperative that all solvent be removed since I have ascertained that a solution of the dye between the glass electrodes does not produce a current on exposure to light. The effect is only produced when the sensitizing dye is in the solid state.

A photoelectric cell of the type illustrated in FIG. 1 of the drawings was exposed to a 100 watt tungsten lamp placed about 4 inches away from the photoelement and in a direction perpendicular to the transparent conductive coating. The current that was produced amounted to approximately 0.5 millimicroampere per $cm.^2$ and the photoelectromotive force was in the order of 0.1 volt. The maximum power output amounted to $6\times10^{-10}$ watts. In this arrangement, the illuminated side of the photocell is negative with respect to the other electrode. Reversal of polarity can be accomplished by simply illuminating first one side and then the other. The polarity can also be reversed by replacing the tungsten light with an ultraviolet light source which, in this case, was a 4 watt fluorescent lamp which peaks at about 360 millimicrons. The ultraviolet light was applied through a Corning glass 7–60 transmitting filter having a band pass between 300 and 400 millimicrons.

The aforedescribed reversal of polarity exhibited by my photoelectric cells constitutes a valuable and useful property. Thus, with the combination of two light sources, tungsten on one side and the ultraviolet side, a synergistic effect is thereby achieved. When so illuminated, my photoelectric cells generated a current exceeding 0.5 millimicroampere per $cm.^2$ at a photoelectromotive force of 0.2 volt using rose bengal as the light-sensitive component. As previously pointed out, the photoelectric cells of the type contemplated herein are useful in converting an A.C. signal to a D.C. output using the construction illustrated in FIG. 4 of the drawing. In this arrangement, a photoelectric cell is constructed according to the specification given for that of FIG. 1. An electroluminescent layer or panel 11 is then placed directly over the photocell FIG. 1 and an A.C. signal applied across the terminals of said electroluminescent panel. The radiation emanating from the electroluminescent layer 11 strikes the photocell of FIG. 1 and produces a D.C. output across the terminals 5 and 6 of the said photoelectric cell. In this particular instance, the electroluminescent panel was excited with a 60 cycle alternating current of 240 volts which produced a photoelectromotive force of about 40 millivolts direct current across the electrodes of the photocell.

It has previously been pointed out that the type of organic dyes which I have found useful in practicing the invention are known as sensitizers. In this instance, sensitizers refer to those dyes generally employed to extend or increase the sensitivity of a photoconductor of processes. It is to be noted in this connection that the the type commonly employed in electrophotographic processes. It is to be noted in this connection that the organic dyes depicted in the above structures are known to be sensitizers for use in electrophotography wherein the light sensitive photoconductor is zinc oxide, and it is my opinion that such sensitizers are generally applicable as the light sensitive dye for the photoelectric cells contemplated herein. The exact mechanism whereby my photoelectric cells transform light energy into electrical energy appears, from the evidence thus far accumulated, to be photovoltaic in nature. Apparently, the absorbed light gradient produces photoelectrons in number proportional to the absorption of that light. This results in a concentration gradient of free electrons in the deposited dye layer. In different strata of the dye layer, different numbers of electrons are released photoelectrically so that the dye layer acts as an electron concentration element with an electromotive force proportional to the electron concentration gradient.

The photoelectric cells made in accordance with this invention have such advantages as simplicity, ease of manufacture and low cost raw materials. The light sensitive dyes employed in my cells are much cheaper and easier to manufacture than the exceedingly high purity silicon used in some types of light sensitive cells. My cells are much easier to fabricate than the well known light sensitive selenium cells which require special high vacuum techniques and equipment in order to deposit thin layers of selenium on suitable supports. The sensitizing dye layers are readily and simply applied in thin layers on suitable supports using solvent solutions of the dyes.

The aforesaid description of my invention represents various ramifications and embodiments thereof. Other modifications and arrangements can be made that fall within the scope of the appended claims.

I claim:

1. A photoelectric cell having as its essential construction a continuous film of a sensitizing dye of the type used to extend the spectrol sensitivity of photoconductive zinc oxide, said dye being selected from the group consisting of the phthalein series and the triphenylmethane series, said film having as a support on each side thereof and in electrical contact therewith an electrically conductive material and wherein at least one of said supports is transparent to light.

2. The photoelectric cell according to claim 1 wherein the light sensitive dye is a phthalein dye.

3. The photoelectric cell according to claim 1 wherein the light sensitive dye is rose bengal.

References Cited in the file of this patent

UNITED STATES PATENTS 2,259,372 Geisler ---------------- Oct. 14, 1941

2,349,754 Porter ---------------- May 23, 1944
2,732,469 Palmer ---------------- Jan. 24, 1956

FOREIGN PATENTS 348,109 Great Britain ------------ May 4, 1931
360,391 Great Britain ---------- Apr. 29, 1930
201,416 Australia --------------- Dec. 1, 1955
1,177,936 France ---------------- Dec. 8, 1958